US009818908B2

(12) United States Patent
Shin et al.

(10) Patent No.: US 9,818,908 B2
(45) Date of Patent: Nov. 14, 2017

(54) METHOD AND APPARATUS FOR MOLDING ENCAPSULANT OF LIGHT EMITTING DEVICE

(75) Inventors: Hyung Jin Shin, Ansan-si (KR); Gi Won Hong, Ansan-si (KR); Young Dae Baek, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 96 days.

(21) Appl. No.: 14/123,638

(22) PCT Filed: May 25, 2012

(86) PCT No.: PCT/KR2012/004186
§ 371 (c)(1),
(2), (4) Date: Mar. 27, 2014

(87) PCT Pub. No.: WO2012/165822
PCT Pub. Date: Dec. 6, 2012

(65) Prior Publication Data
US 2015/0034984 A1    Feb. 5, 2015

(30) Foreign Application Priority Data

Jun. 3, 2011    (KR) .......................... 10-2011-0053949

(51) Int. Cl.
*H01L 33/00* (2010.01)
*H01L 21/56* (2006.01)
(Continued)

(52) U.S. Cl.
CPC ............ *H01L 33/005* (2013.01); *H01L 21/56* (2013.01); *H01L 21/565* (2013.01); *H01L 24/97* (2013.01);
(Continued)

(58) Field of Classification Search
CPC ....... H01L 2924/00; H01L 2924/00014; H01L 2224/48247; H01L 2224/73265;
(Continued)

(56) References Cited

U.S. PATENT DOCUMENTS 6,344,162 B1    2/2002  Miyajima
7,803,641 B2 *  9/2010  Wang ..................... H01L 21/561
                                                          438/106

(Continued)

FOREIGN PATENT DOCUMENTS

KR    10-2000-0011536    2/2000
KR    10-2008-0096749    11/2008
(Continued)

OTHER PUBLICATIONS

International Search Report dated Nov. 28, 2012 in the International Application No. PCT/KR2012/004186.
(Continued)

*Primary Examiner* — Tony Tran
(74) *Attorney, Agent, or Firm* — H.C. Park & Associates, PLC

(57) ABSTRACT

Disclosed is an apparatus for forming an encapsulation material for a light emitting device. The apparatus for forming an encapsulation material comprises: an upper mold on which is mounted a substrate having a plurality of optical semiconductors; a lower mold arranged opposite the upper mold; a resin-capture space for capturing a resin between the upper mold and the lower mold; and an ejector pin for dividing the resin-capture space into a plurality of spaces at the position where the encapsulating material is formed, thereby dividing the encapsulation material into a plurality of parts formed on the substrate.

7 Claims, 4 Drawing Sheets

(51) Int. Cl.
*H01L 23/00* (2006.01)
*H01L 33/54* (2010.01)
*H01L 33/58* (2010.01)
*H01L 21/67* (2006.01)

(52) U.S. Cl.
CPC .......... *H01L 33/0095* (2013.01); *H01L 33/54* (2013.01); *H01L 33/58* (2013.01); *H01L 21/67126* (2013.01); *H01L 2924/12041* (2013.01); *H01L 2924/12042* (2013.01); *H01L 2924/15787* (2013.01); *H01L 2924/181* (2013.01); *H01L 2933/005* (2013.01); *H01L 2933/0058* (2013.01)

(58) Field of Classification Search
CPC . H01L 2224/32245; H01L 2924/00012; H01L 2224/48091
See application file for complete search history.

(56) References Cited

U.S. PATENT DOCUMENTS

2001/0008775 A1* 7/2001 Yamamoto .................. 438/106
2006/0102914 A1  5/2006 Smits et al.
2007/0181903 A1* 8/2007 Takakura ..................... 257/100
2009/0291532 A1  11/2009 Takase et al.

FOREIGN PATENT DOCUMENTS

KR  10-2009-0077200  7/2009
KR  10-2009-0127296  12/2009

OTHER PUBLICATIONS

Written Opinion dated Nov. 28, 2012 in the International Application No. PCT/KR2012/004186.

* cited by examiner

METHOD AND APPARATUS FOR MOLDING ENCAPSULANT OF LIGHT EMITTING DEVICE

CROSS-REFERENCE TO RELATED APPLICATIONS

This application is the National Stage Entry of International Application PCT/KR2012/004186, filed on May 25, 2012, and claims priority from and the benefit of Korean Patent Application No. 10-2011-0053949, filed on Jun. 3, 2011, all of which are incorporated herein by reference for all purposes as if fully set forth herein.

BACKGROUND

Field

The present invention relates to a method and apparatus for molding an encapsulant of light emitting devices, and more particularly, to a method and apparatus for molding encapsulants, which can mold plural encapsulants on a single substrate through a single molding process, with the encapsulants separated from each other.

Discussion of the Background

A number of light emitting devices can be prepared through a series of processes of forming an encapsulant, which wholly covers a plurality of optical semiconductors mounted on a large-area ceramic substrate, cutting and separating the ceramic substrate and the encapsulant into numerous pieces. Laser cutting, dicing or breaking may be used to cut the ceramic substrate into a number of pieces.

However, since it is impossible in practice to select a laser source capable of simultaneously cutting the ceramic substrate and the encapsulant, a process of cutting the encapsulant must be additionally performed separately from a process of cutting the ceramic substrate, when a method for cutting the ceramic substrate with a laser beam is used. As such, conventional techniques suffer from time loss and economic loss since the process of cutting the encapsulant must be additionally performed separately from the process of cutting the ceramic substrate.

SUMMARY

The present invention is aimed at providing a method for molding an encapsulant, which can omit a cutting process after molding an encapsulant by separately molding individual encapsulants corresponding to a plurality of light emitting devices when the encapsulant is molded on a single substrate.

The present invention is also aimed at providing an apparatus for molding an encapsulant, which can omit a cutting process after molding an encapsulant by separately molding individual encapsulants corresponding to a plurality of light emitting devices when the encapsulant is molded on a single substrate.

In accordance with one aspect of the present invention, an apparatus for molding an encapsulant of light emitting devices is provided. The apparatus for molding an encapsulant includes: an upper mold, on which a substrate including a plurality of optical semiconductors mounted thereon is mounted; a lower mold placed to face the upper mold; a resin confining space confining a resin between the upper and lower molds; and an ejector pin dividing the resin confining space into a plurality of sections at an encapsulant molding location such that the encapsulant molded on the substrate is separated into a plurality of pieces by the ejector pin.

According to one embodiment, the ejector pin is raised to a height for contacting the substrate through an upper surface of the lower mold to separate the encapsulant into the plural pieces. The lower mold includes a mesh type cross-sectional guide gap formed therein and the ejector pin has a mesh type cross-section capable of moving up and down through the guide gap.

According to one embodiment, the lower mold includes a plurality of lens molding cavities on an upper surface thereof.

According to one embodiment, the resin confining space is formed by elevating a resin confining frame placed around the lower mold to a height for contacting the upper mold or the substrate.

According to one embodiment, the apparatus further includes a release film disposed to cover the lower mold on the lower mold and the ejector pin.

In accordance with another aspect of the present invention, a method for molding an encapsulant of light emitting devices is provided. The method for molding an encapsulant includes: mounting a substrate, on which a plurality of optical semiconductors is mounted, on an upper mold; forming a resin confining space between the upper mold and a lower mold, followed by placing a liquid or gel-phase resin in the resin confining space; molding the resin in the resin confining space into an encapsulant shape by elevating the lower mold; and separating an encapsulant on the substrate into a plurality of pieces by dividing the resin confining space into a plurality of sections using an ejector pin.

According to one embodiment, the encapsulant is separated into the plural pieces by elevating the ejector pin from a height of an upper surface of the lower mold or less to a height for contacting the substrate. The lower mold includes a mesh type cross-sectional guide gap formed therein and the ejector pin has a mesh type cross-section capable of moving up and down through the guide gap.

According to one embodiment, the lower mold includes a plurality of lens molding cavities on an upper surface thereof, and the lens molding cavities allow lenses to be formed corresponding to the plural separated pieces of the encapsulant, respectively.

According to one embodiment, for formation of the resin confining space, a resin confining frame placed around the lower mold is raised to a height for contacting the upper mold or the substrate.

According to one embodiment, before the liquid or gel-phase resin is placed in the resin confining space, a release film is disposed to cover at least a lower side of the resin confining space.

In accordance with a further aspect of the present invention, a light emitting device includes: a substrate having a cut surface; an optical semiconductor formed on the substrate; and an encapsulant formed on the substrate to cover the optical semiconductor, wherein an edge of the encapsulant is placed inside the cut surface away from the same line as that of the cut surface.

According to one embodiment, the cut surface is formed by at least one of laser cutting, dicing and breaking, and the edge of the encapsulant includes a separating portion formed upon molding of the encapsulant.

According to one embodiment, the encapsulant includes: a lens; and a rim around the lens, and the rim includes an inclined portion which is formed around the rim and becomes thinner towards an outside thereof.

According to the present invention, when an encapsulant is molded on a single substrate, individual encapsulants corresponding to plural light emitting devices are separately molded, thereby omitting a cutting process after molding the encapsulant. Conventionally, since it is difficult to select a laser capable of simultaneously cutting a ceramic substrate and an encapsulant which covers an overall upper surface of the ceramic substrate, it is difficult to use a method for cutting a ceramic substrate with a laser. However, according to the present invention, since the encapsulant is not limitedly present in regions of the ceramic substrate to be cut, the plural light emitting devices can be separated from the ceramic substrate by cutting only the ceramic substrate using laser cutting, dicing and/or breaking. When laser full cutting equipment is used, since a laser source suitable for cutting a substrate, particularly, a ceramic substrate, can be selected, an efficient cutting process is possible.

As described above, although introduction of the method for simultaneously cutting an encapsulant and a ceramic substrate with a laser beam has been considered, the method could not realize a light emitting device having desired quality due to severe damage of the encapsulant by the laser beam. However, according to the present invention, a light emitting device having a desired lens shape can be realized without damage of the encapsulant. In the light emitting device according to the present invention, an edge of the encapsulant is completely separated from a cut surface (particularly, a laser-cut surface) of the substrate, and is provided with an inclined portion gradually becoming thinner towards the outside thereof. This structure is extremely advantageous to reduction of interfacial peeling between the encapsulant and the substrate, as compared with a conventional method, in which the cut surface of the substrate is collinear with the edge of the encapsulant.

DETAILED DESCRIPTION OF THE ILLUSTRATED EMBODIMENTS

Hereinafter, exemplary embodiments of the present invention will be described in detail with reference to the accompanying drawings. It should be understood that the present invention is not limited to the following embodiments and may be embodied in different ways, and that the embodiments are provided for complete disclosure and thorough understanding of the invention by those skilled in the art.

Figure 1:
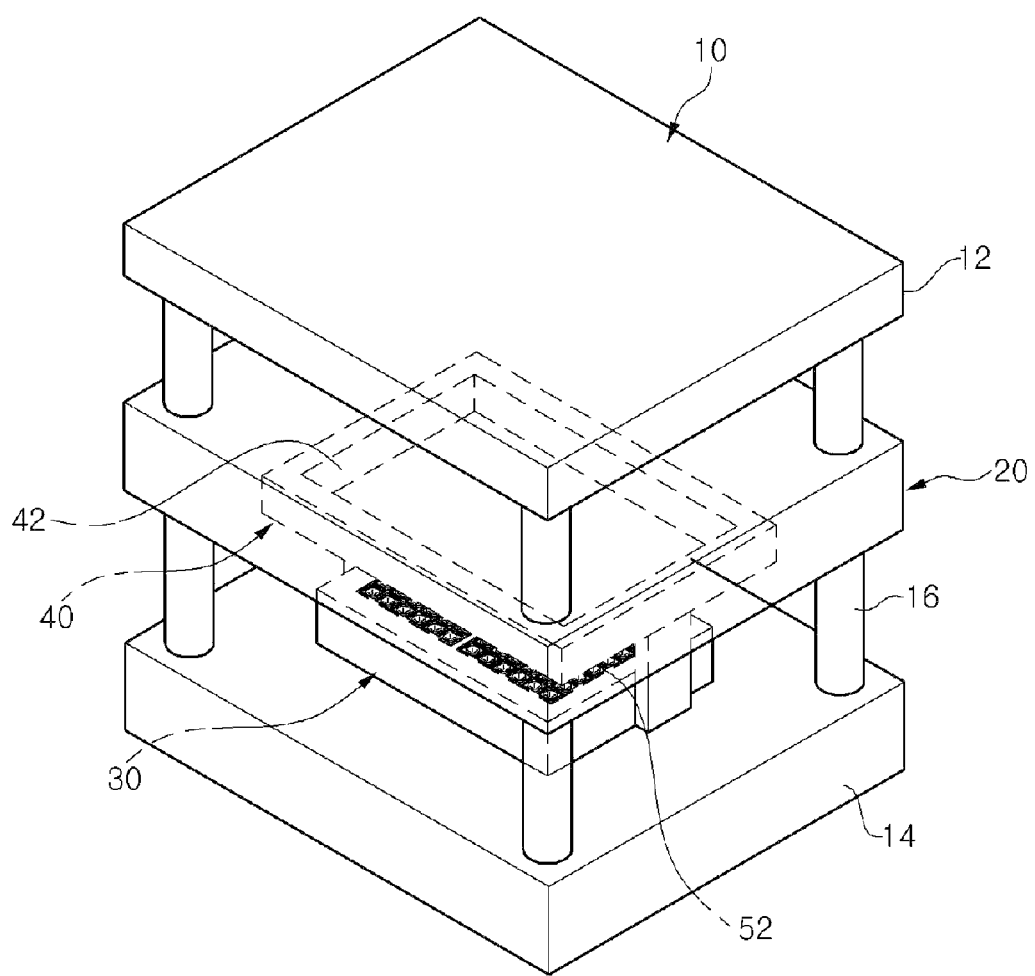
FIG. 1 is a perspective view of an apparatus for molding an encapsulant of light emitting devices according to one embodiment of the present invention.
Figure 2:
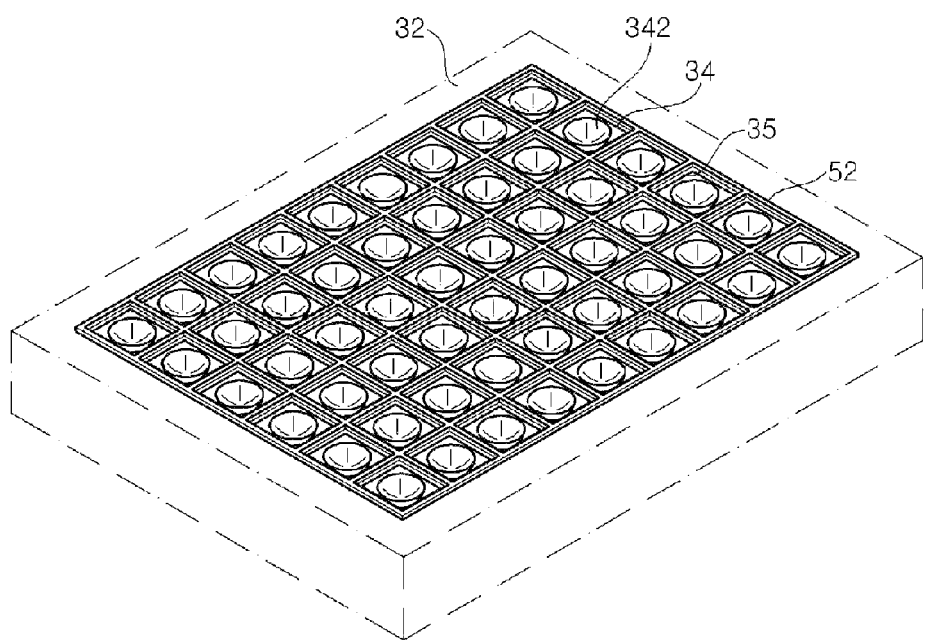
FIG. 2 is a partially enlarged perspective view of the apparatus of FIG. 1.
Figure 5:
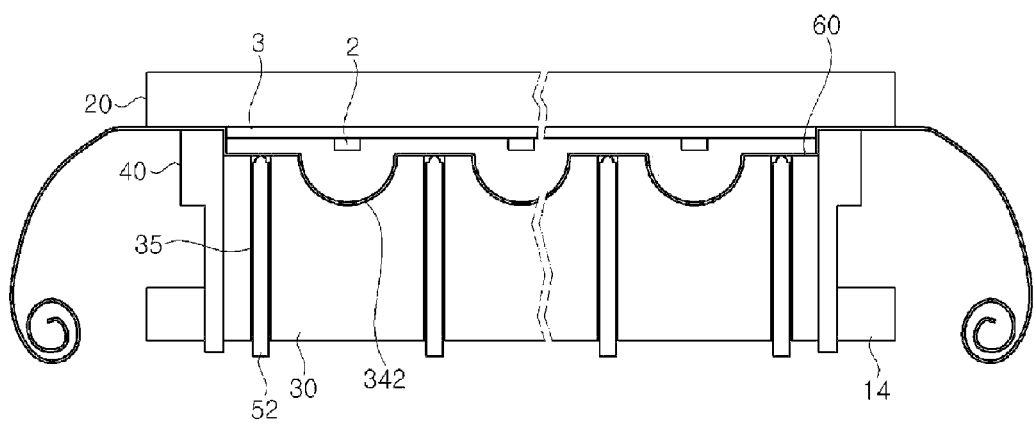
Figure 6:
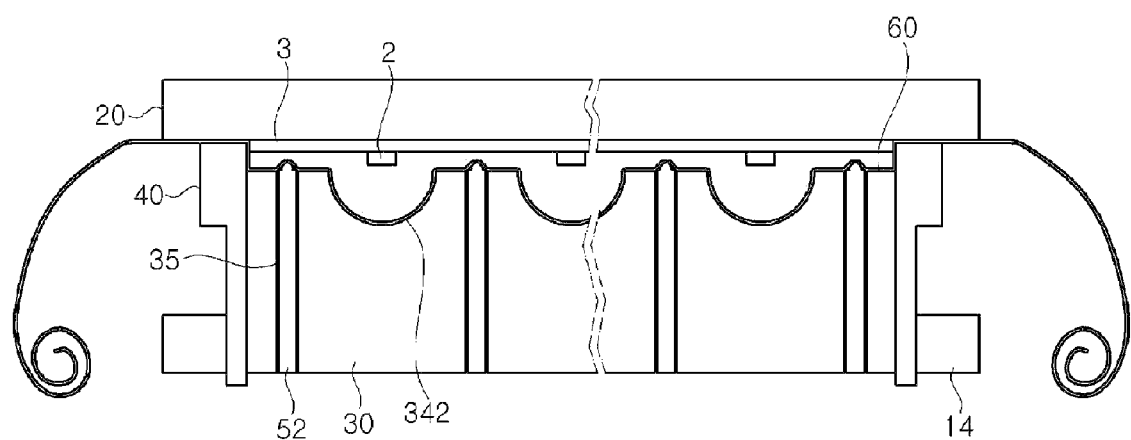
Figure 7:
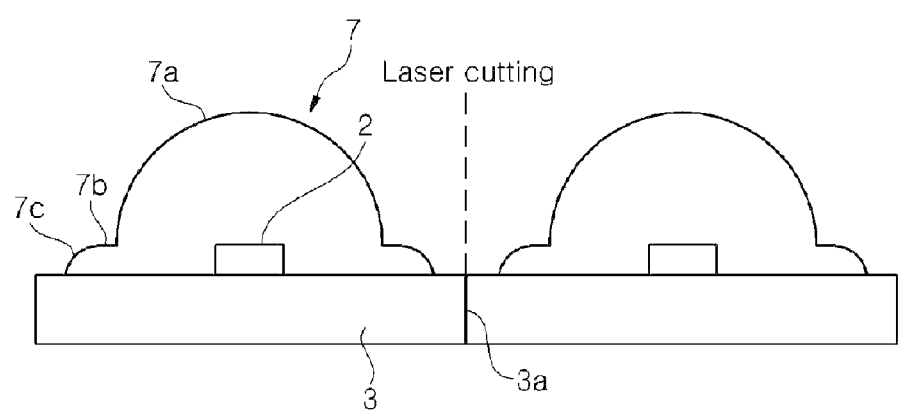
FIG. 7 is a view of light emitting devices prepared using the apparatus for molding an encapsulant shown in FIGS. 1 to 6.

FIG. 1 is a perspective view of an apparatus for molding an encapsulant of light emitting devices according to one embodiment of the present invention, FIG. 2 is a partially enlarged perspective view of the apparatus of FIG. 1, FIGS. 3 to 6 are sectional views illustrating operation of the apparatus for molding an encapsulant shown in FIG. 1 and a method for molding an encapsulant using the same, and FIG. 7 is a view of light emitting devices prepared using the apparatus for molding an encapsulant shown in FIGS. 1 to 6.

Referring to FIG. 1, an apparatus for molding an encapsulant according to one embodiment of the invention includes a frame structure 10, an upper mold 20, a lower mold 30, a resin confining frame 40, and an ejector pin 52.

The frame structure 10 includes an upper plate frame 12, a lower plate frame 14, and four pillar frames 16 vertically connecting the upper plate frame 12 to the lower plate frame 14.

The upper mold 20 is coupled at four corners thereof to the four pillar frames 16 to be secured to the frame structure 10. The lower mold 30 and the resin confining frame 40 are disposed on the frame structure 10 so as to be moved up and down. The lower plate frame 14 is provided with a guide member for guiding vertical movement of the lower mold 30 and the resin confining frame 40. Although not shown, the lower plate frame 14 is provided at a lower side thereof with at least one driving device for driving the lower mold 30 and the resin confining frame 40 up and down.

A large area ceramic substrate is mounted on a flat lower surface of the upper mold 20. The ceramic substrate includes a plurality of optical semiconductors mounted on an opposite surface to the mounting surface for the upper mold 20, that is, on a main surface thereof. In this embodiment, the optical semiconductors mounted on the main surface of the ceramic substrate may be light emitting diode chips. In addition, the ceramic substrate includes various sets of conductive patterns, which correspond to the various optical semiconductors and are formed on the main surface thereof.

As shown well in FIG. 2, the lower mold 30 includes a rim 32 and a plurality of blocks 34 placed in a matrix arrangement at regular intervals inside the rim 32. In this embodiment, the rim 32 has a substantially quadrangular frame shape, and each of the plural blocks 34 has an approximate rectangular parallelepiped (or regular hexahedron) shape. The lower mold 30 includes a mesh type cross-sectional guide gap 35 formed by the rim 32 and the plural blocks 34. The rim 32 and the plural blocks 34 are integrally connected to each other by a certain connecting member under the lower mold 30. The rim 32 and the plural blocks 34 are integrated to each other within the lower mold 30 and thus simultaneously moved by a lower mold driving device, which is not shown.

In addition, the mesh type cross-sectional ejector pin 52 is slidably inserted into the guide gap 35 to be placed therein. As means for moving the ejector pin 52 up and down, the ejector pin 52 includes legs integrally connected to both lower sides thereof. The legs are connected to a certain driving device placed under the legs. Thus, the ejector pin 52 is driven up and down by the driving device. Here, the mesh type cross-sectional guide gap 35 serves to guide slidable up-and-down movement of the ejector pin 52.

As shown well in FIG. 1, the resin confining frame 40 includes a substantially quadrangular opening 42 guiding slidable up-and-down movement of the lower mold 30. Inner lateral sides of the opening 42 slidably contact outer lateral sides of the lower mold 30, specifically, outer lateral sides of the rim 32 (see FIG. 2). The resin confining frame 40 may also be driven by a driving device under the resin confining frame 40. In addition, the lower mold 30 is slidably driven up and down while contacting the inner lateral sides of the opening 42 of the resin confining frame 40.

The lower mold 30, the resin confining frame 40 and the ejector pin 52 may be driven by separate driving devices. Alternatively, at least two of the lower mold 30, the resin confining frame 40 and the ejector pin 52 may be driven by one driving device. For example, when a spring is used as a support member, two different elements are initially elevated together by one driving device. Then, one of the elements is stopped at a certain height and only the spring supporting the one element is compressed at the same time, while the other element is continuously raised.

Referring again to FIG. 2, the lower mold 30 includes the rim 32 having a certain height and the plural rectangular parallelepiped blocks 34 disposed in a matrix inside the rim 32. The mesh type cross-sectional guide gap 35 is formed by the rim 32 and the plural blocks 34. In addition, each of the blocks 34 is formed on an upper surface thereof with a substantially semi-spherical lens molding cavity, which defines a lens shape. The ejector pin 52 has a mesh type structure and is inserted into the guide gap 35 while forming a plurality of sections. Each of the sections surrounds a single block 34 therein.

Figure 3:
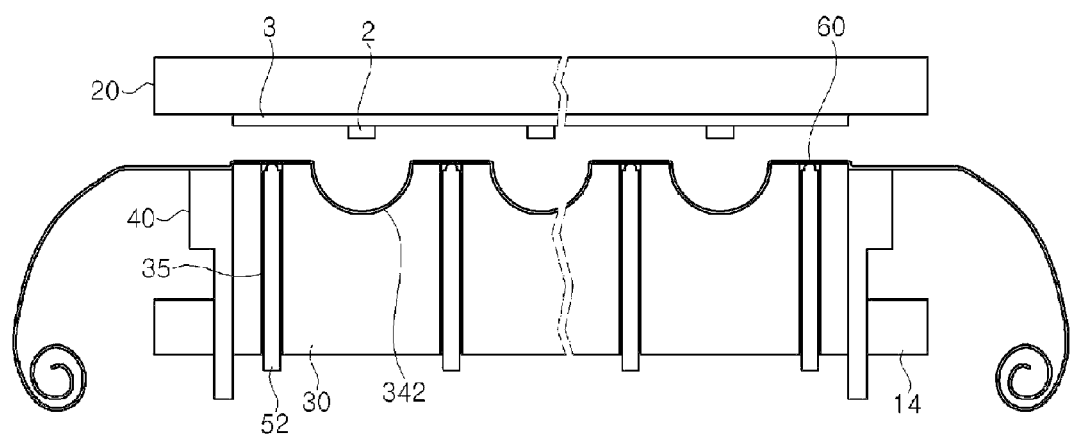
FIGS. 3 to 6 are sectional views illustrating operation of the apparatus for molding an encapsulant shown in FIG. 1 and a method for molding an encapsulant using the same.

Referring to FIG. 3, the upper and lower molds 20, 30 are disposed to face each other at upper and lower sides of a frame structure, which is provided with a lifting device, such as a pressing machine. The upper mold 20 and/or the lower mold 30 may be provided with heaters (not shown) for heating a resin to a preset temperature.

In this embodiment, the ceramic substrate 3 including a plurality of optical semiconductors 2 mounted on the main surface thereof is mounted on a lower surface of the upper mold 20. The ceramic substrate 3 may be fed to the upper mold 20 by a separate substrate feeder (not shown), and then mounted thereon. Here, the plural optical semiconductors 2 are directed towards the lower mold 30.

The ceramic substrate 3 may be mounted on the lower surface of the upper mold 20 by vacuum adsorption or clamping. In addition, other methods may also be used for mounting the ceramic substrate 3 on the upper mold 20. The ceramic substrate 3 is fed, with the upper and lower molds 20, 30 separated a certain distance from each other. A wide surface of the ceramic substrate 3, on which the encapsulant will be molded, that is, the main surface of the ceramic substrate 3 mounted on the upper mold 20 is directed towards the lower mold 30. Here, the plurality of lens molding cavities 342 for molding lenses of a plurality of light emitting devices is formed on an upper surface of the lower mold 30.

The resin confining frame 40 is placed around the lower mold 30. The lower mold 30 includes the mesh type cross-sectional guide gap 35 (see FIG. 2) formed therein, and the mesh type cross-sectional ejector pin 52 (see FIG. 2) is kept inserted in the guide gap 35 so as to move up and down. A release film 60 is disposed on the upper surface of the lower mold 30 to cover upper ends of the lower mold 30 and the ejector pin 52. In this embodiment, the release film 60 protrudes through the resin confining frame 40.

The release film 60 is provided to facilitate easy separation of the encapsulant from the lower mold 30 after molding the encapsulant on the ceramic substrate 3. In addition, the release film 60 may also serve to block the liquid or gel-phase resin from being leaked down from the lower mold 30, for example, through the guide gap and the like. Thus, if other structures or methods are used for blocking leakage of the resin, the release film 60 may be omitted and, for example, a certain release material, such as release coating materials and the like, may be applied to the surface of the lower mold 30 such that the encapsulant is easily separated from the lower mold 30.

Figure 4:
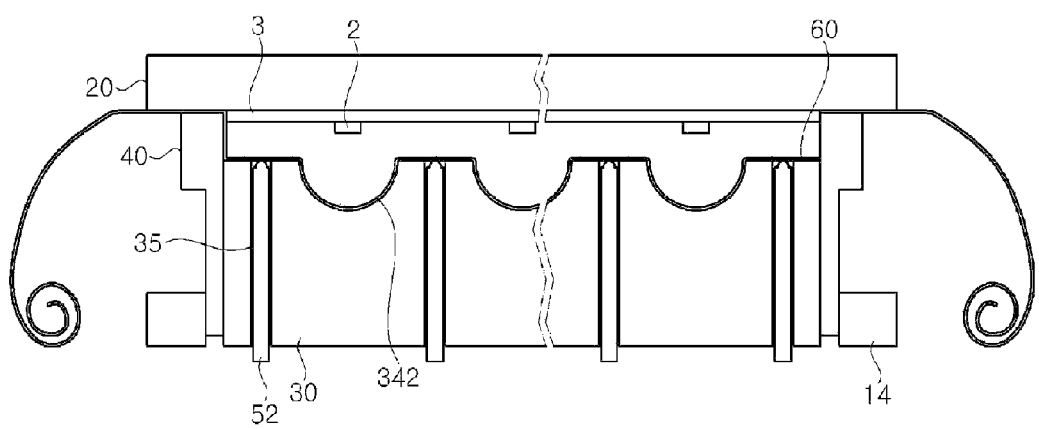

Referring to FIG. 4, the resin confining frame 40 is first raised to a location for contacting the upper mold 20. Thus, the resin confining space is formed between the upper and lower molds 20, 30. Alternatively, the resin confining frame 40 may also be raised to a height for contacting the substrate 3 mounted on the upper mold 20. The resin confining space is filled with a light-transmitting liquid or gel-phase resin. Although a silicone resin is advantageously used as the light-transmitting resin, other light-transmitting resins, such as epoxy resins and the like, may also be used.

Referring to FIG. 5, with the resin confining frame 40 secured, the lower mold 30 is raised to an encapsulant molding location. As a result, the resin confining space defined by the resin confining frame 40 has a reduced volume, thereby compressing the resin into an intended encapsulant shape. Here, the lens shape of the encapsulant is determined by the lens molding cavity 342 of the lower mold 30. In this embodiment, the ejector pin 52 is raised to the same height as the lower mold 30 along therewith. However, at the encapsulant molding location, the ejector pin 52 does not perform an inherent function of dividing the encapsulant into light emitting device units.

Referring to FIG. 6, with the resin confining frame 40 and the lower mold 30 secured, the ejector pin 52 is further raised from a height of the upper surface of the lower mold 30 or less to a height for contacting the lower surface of the ceramic substrate 3 through the upper surface of the lower mold 30. Since the ejector pin 52 pushes the resin aside, the resin is not present in a region, in which the ejector pin 52 is present. Since the ejector pin 52 has a shape defining a plurality of sections, the resin confining space is divided into plural sections by the ejector pin 52. In each of the sections divided by the ejector pin 52, an individual encapsulant corresponding to one light emitting diode is formed.

FIG. 7 shows a process, by which a half-finished product prepared through the aforementioned process is cut into a plurality of pieces, thereby producing a plurality of light emitting devices. Referring to FIG. 7, encapsulants 7, which individually encapsulate a plurality of optical semiconductors 2, are formed on a ceramic substrate 3. Each of the encapsulants 7 includes a semi-spherical lens 7a and a flat rim 7b around the lens 7a. The rim 7b has an inclined portion 7c becoming thinner towards an outside thereof. Between adjacent encapsulants 7, the ceramic substrate 3 is cut by a laser beam. Since the encapsulants 7 are already separated on the ceramic substrate 3, the light emitting devices can be separated by a simple process of cutting the ceramic substrate 3. The ceramic substrate 3 may be cut using at least one of laser cutting, dicing, and breaking.

In the light emitting device prepared through the aforementioned process, each encapsulant 7 is limitedly formed inside a cut surface 3a away from the same line as that of the cut surface 3a, and the inclined portion 7c becoming thinner towards the outside of the rim is formed around the encapsulant 7, particularly, along an edge of the rim 7b. This structure improves adhesion of the encapsulant 7 to the ceramic substrate 3, and thus may contribute to prevention of interfacial peeling, which may occur between the ceramic substrate 3 and the encapsulant.

According to the present invention, when an encapsulant is molded on a single substrate, individual encapsulants corresponding to plural light emitting devices are separately molded, thereby omitting a cutting process after molding the encapsulant. Conventionally, since it is difficult to select a laser capable of simultaneously cutting a ceramic substrate and an encapsulant which covers an overall upper surface of the ceramic substrate, it is difficult to use a method for cutting a ceramic substrate with a laser. However, according to the present invention, since the encapsulant is not limitedly present in regions of the ceramic substrate to be cut, the plural light emitting devices can be separated from the ceramic substrate by cutting only the ceramic substrate using laser cutting, dicing and/or breaking. When laser full cutting equipment is used, since a laser source suitable for cutting a substrate, particularly, a ceramic substrate, can be selected, an efficient cutting process is possible.

As described above, although introduction of the method for simultaneously cutting an encapsulant and a ceramic substrate with a laser beam has been considered, the method could not realize a light emitting device having desired quality due to severe damage of the encapsulant by the laser beam. However, according to the present invention, a light emitting device having a desired lens shape can be realized without damage of the encapsulant. In the light emitting device according to the present invention, an edge of the encapsulant is completely separated from a cut surface (particularly, a laser-cut surface) of the substrate, and is provided with an inclined portion gradually becoming thinner towards the outside thereof. This structure is extremely advantageous to reduction of interfacial peeling between the encapsulant and the substrate, as compared with a conventional method, in which the cut surface of the substrate is collinear with the edge of the encapsulant.

What is claimed is:

1. An apparatus for molding an encapsulant of light emitting devices, comprising:
   an upper mold configured to support a substrate comprising optical semiconductors mounted thereon;
   a lower mold disposed to face the upper mold and configured to at least partially form a resin confining space; and
   an ejector pin having hollow cross-sectional shapes defining a plurality of enclosed spaces configured to divide the resin confining space into sections such that the encapsulant molded on the substrate and disposed in the resin confining space is separated into pieces by the ejector pin,
   wherein the lower mold comprises an upper surface comprising molding cavities having a semi-spherical shape and each semi-spherical shaped molding cavity is entirely surrounded by the ejector pin and disposed within one of the plurality of enclosed spaces of the ejector pin.

2. The apparatus of claim 1, wherein the ejector pin is configured to extend from an upper surface of the lower mold to separate the encapsulant into the pieces.

3. The apparatus of claim 2, wherein:
   the lower mold comprises a mesh type cross-sectional guide gap formed therein; and
   the ejector pin has a mesh type cross-section and is configured to selectively extend from the guide gap.

4. The apparatus of claim 1, further comprising a resin confining frame configured to be disposed around the lower mold and contact at least one of the upper mold and the substrate.

5. The apparatus of claim 1, further comprising a release film covering the lower mold and the ejector pin.

6. The apparatus of claim 1, wherein the lower mold is configured to form a semi-spherical shape portion of the encapsulant and the ejector pin is configured to form an inclined portion of the encapsulant surrounding each semi-spherical shaped portion of the encapsulant.

7. The apparatus of claim 1, wherein at least one of the upper mold and the lower mold comprises a heater.

* * * * *